United States Patent
Utsumi et al.

(10) Patent No.: US 6,821,624 B2
(45) Date of Patent: Nov. 23, 2004

(54) AMORPHOUS CARBON COVERED MEMBER

(75) Inventors: Yoshiharu Utsumi, Itami (JP); Kazuhiko Oda, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 4 days.

(21) Appl. No.: 09/790,609

(22) Filed: Feb. 23, 2001

(65) Prior Publication Data

US 2001/0024737 A1 Sep. 27, 2001

(30) Foreign Application Priority Data

Feb. 25, 2000 (JP) .......................................... 2000-049327
Jan. 25, 2001 (JP) .......................................... 2001-016954

(51) Int. Cl.[7] .......................... C10G 31/04; C23C 14/00
(52) U.S. Cl. .................. 428/408; 428/216; 428/217; 428/336; 428/698; 51/307; 204/192.1; 204/192.11; 204/192.16; 204/192.32; 204/192.34; 429/532; 429/584
(58) Field of Search ................................ 428/408, 336, 428/217, 698, 216, 469, 472; 51/307; 204/192.1, 192.11, 192.16, 193.32, 192.34; 437/542, 584

(56) References Cited

U.S. PATENT DOCUMENTS

| | | | |
|---|---|---|---|
| 4,842,937 A | * | 6/1989 | Meyer et al. |
| 5,028,451 A | * | 7/1991 | Ito et al. |
| 5,135,808 A | * | 8/1992 | Kimock et al. |
| 5,232,568 A | * | 8/1993 | Parent et al. |
| 5,249,554 A | * | 10/1993 | Tamor et al. |
| 5,295,305 A | * | 3/1994 | Hahn et al. |
| 5,629,086 A | * | 5/1997 | Hirano et al. |
| 5,725,573 A | * | 3/1998 | Dearnaley et al. |
| 5,925,422 A | * | 7/1999 | Vadenbulcke et al. |
| 6,022,622 A | * | 2/2000 | Domoto et al. |
| 6,080,445 A | * | 6/2000 | Sugiyama et al. |
| 6,165,616 A | * | 12/2000 | Lemelson et al. |
| 6,284,376 B1 | * | 9/2001 | Takenouchi et al. |
| 6,335,086 B1 | * | 1/2002 | Veerasamy |
| 6,410,125 B1 | * | 6/2002 | Brenner et al. |

FOREIGN PATENT DOCUMENTS

| | | | |
|---|---|---|---|
| EP | 469204 | * | 2/1992 |
| EP | 0 474 369 | * | 3/1992 |
| EP | 0 549 801 | * | 7/1993 |
| EP | 0 589 641 | * | 3/1994 |
| EP | 0 605 179 | * | 7/1994 |
| EP | 0 738 787 | * | 10/1996 |
| JP | 61-258713 | * | 11/1986 |
| JP | 62-116767 | * | 5/1987 |
| JP | 63-286334 | * | 11/1988 |
| JP | 64-79372 | | 3/1989 |
| JP | 1-317197 | * | 12/1989 |
| JP | 02-120245 | * | 5/1990 |
| JP | 02-149673 | * | 6/1990 |
| JP | 04-154633 | * | 5/1992 |
| JP | 04-154634 | * | 5/1992 |
| JP | 05-168774 | * | 7/1993 |
| JP | 5-274656 | | 10/1993 |
| JP | 05-82472 | | 11/1993 |
| JP | 05-320910 | * | 12/1993 |
| JP | 07-316818 | * | 12/1995 |
| JP | 07-330490 | * | 12/1995 |
| WO | 99/27147 | * | 6/1999 |

OTHER PUBLICATIONS

English Language Abstract of JP 64–79372.
English Language Abstract of JP 05–82472.
English Language Abstract of JP 5–274656.

* cited by examiner

*Primary Examiner*—Archene Turner
(74) *Attorney, Agent, or Firm*—Greenblum & Bernstein P.L.C.

(57) ABSTRACT

For machine parts, cutting tools and molds used under extremely high contact pressures, an amorphous carbon film is provided which has a sufficient adhesion to a substrate. The amorphous carbon covered member has an interlayer comprising at least one element selected from the group consisting of elements in the IVa, Va, VIa and IIIb groups and the IVb group except carbon in the periodic table, or a carbide of at least one element selected from the group, and an amorphous carbon film formed on the interlayer. The interlayer has a thickness of 0.5 nm or over and less than 10 nm.

27 Claims, 4 Drawing Sheets

AMORPHOUS CARBON COVERED MEMBER

BACKGROUND OF THE INVENTION

The present invention relates to an amorphous carbon covered member used for machine parts, molds, cutting tools, sliding parts, etc. to improve wear resistance, sliding properties and surface protective function.

Amorphous carbon films are carbon films or hydrogenated carbon films which are amorphous and also called diamond-like carbon (DLC), carbon hard films, a-C, a-C:H, or i-C. Since amorphous carbon films have excellent characteristics such as high hardness, high plane evenness and low friction coefficient, application to machine parts, molds, cutting tools, sliding parts, etc. for which wear resistance and low friction coefficient are required is expected. They are actually used for some of them.

As methods of forming amorphous carbon films, plasma CVD using a hydrocarbon gas such as $CH_4$, sputter deposition, ion plating, vacuum arc deposition, etc. are used. But since adhesion between the substrate and the amorphous carbon film is poor, various methods for improving adhesion have been proposed. As a general way of improving adhesion of amorphous carbon films, forming an interlayer of various structures between the substrate and the amorphous carbon film have heretofore been tried. For example, in Japanese patent publication 64-79372, a method is disclosed in which after a 50–1000 nm thick interlayer of titanium carbide has been formed on a substrate by vapor phase synthesis, an amorphous carbon film is formed by vapor phase synthesis.

Also, Japanese patent publication 5-82472 discloses a structure in which an interlayer 0.1–10 µm thick comprising at least one of carbides, carbonitrides, carbooxides, carbooxinitrides, carboborides of metals in the IVa, Va and VIa groups in the periodic table, carbides or carbonitrides of Si, or mutual solid solutions thereof is formed on a sintered alloy comprising at least one of carbides, nitrides or mutual solid solutions of metals in the IVa, Va and Via groups in the periodic table, and an amorphous carbon film is formed thereon.

Heretofore, the thickness of the interlayer was usually 50 nm or over. If an amorphous carbon film was formed on such a thick interlayer, adhesion was insufficient for machine parts, cutting tools and molds that are used under extremely high contact pressure. Fields were limited to which an amorphous carbon film was applicable.

SUMMARY OF THE INVENTION

After studying various structures to improve adhesion of an amorphous carbon film, it has been found out by the applicant that the following structure makes it possible to realize an amorphous carbon covered member which has such a high adhesion as to be applicable to machine parts, cutting tools, molds, etc.

Specifically, it has been found out that by forming on a substrate an interlayer comprising at least one element selected from the group consisting of elements in the IVa, Va, VIa and IIIb groups in the periodic table and elements in the IVb group except carbon, or carbides of at least one element selected from the abovesaid groups, and forming on the interlayer an amorphous carbon film so that the thickness of the interlayer will be 0.5 nm or over and less than 10 nm, it is possible to markedly improve the adhesion of the amorphous carbon film to the substrate.

As a structure for obtaining an amorphous carbon covered member that is superior in the adhesion to the substrate, the present invention is characterized by the material, film thickness and forming method of the interlayer.

As the material for the interlayer, at least one element selected from the group consisting of elements in the IVa, Va, VIa and IIIb groups in the periodic table and elements in the IVb group except carbon can be used. Since these elements react with carbon and form carbides, by forming an amorphous carbon film on the interlayer comprising one of these elements, a bond of such an element and carbon is formed at the interface between the interlayer and the amorphous carbon film, so that a high adhesion is achieved.

Otherwise, carbides of these elements may be used as the material for the interlayer. By forming an amorphous carbon film on the interlayer of such a carbide, a bond between the carbon in the carbide and the carbon in the amorphous carbon, or a bond between one of the elements in the IVa, Va, VIa and IIIb groups in the periodic table or one of the elements in the IVb group except carbon and the carbon in the amorphous carbon is formed at the interface between the interlayer and the amorphous carbon film, so that a high adhesion is obtained. These carbides may be of a composition within or out of a stoichiometric ratio.

Among these materials, it is especially preferable to use for the interlayer at least one element selected from the group consisting of Ti, Zr, Hf, v, Nb, Ta, Cr, Mo, W and Si, or a carbide of at least one element selected from the group. Since these elements are substances that can easily form carbides, by forming an amorphous carbon film on an interlayer of one of these elements or a carbide of one of these elements, a stable and rigid bond is formed at the interface between the interlayer and the amorphous carbon film, so that an extremely high adhesion is achieved.

In the present invention, the thickness of the interlayer is preferably 0.5 nm or over and less than 10 nm. By making it thinner than the thickness of interlayers used in the prior art, it is possible to obtain a high adhesion that was impossible in the prior art. If the thickness of the interlayer is thinner than 0.5 nm, the interlayer cannot perform functions as the interlayer because it is difficult to form a continuous film that is uniform in thickness over the entire surface of the substrate. If the thickness of the interlayer is over 10 nm, no sufficient adhesion is obtainable because the adhesion at the interface between the substrate and the interlayer or at the interface between the interlayer and the amorphous carbon film decreases. More preferably, the thickness of the interlayer is 2 nm or over and 7 nm or under.

As a method of forming the interlayer, a known method can be used such as vacuum deposition, sputter deposition, vacuum arc deposition, ion plating or various CVD. Among them, ion plating, sputter deposition and vacuum arc deposition are especially preferable because of high ionization rate of the raw material, and because due to the effect of driving ions into the substrate, a high adhesion between the interlayer and the substrate is obtained.

If the interlayer is formed on the substrate after contamination and an oxide layer on the substrate surface have been removed by irradiating the substrate surface with ions, a higher adhesion is obtained. Thus doing so is preferable. As a method of cleaning the substrate surface by ion irradiation, a known technique may be used.

According to the method of ion irradiation to the substrate surface, it is possible to simultaneously carry out the cleaning of the substrate surface by etching and the formation of the interlayer. Since a DLC film formed on the interlayer by this method is especially superior in adhesion, it is preferable.

Ion irradiation is carried out by applying a negative bias voltage to the substrate at least in the presence of ions of elements forming the interlayer. As a method of producing ions, a known technique may be used. But the use of a sputter evaporation source or a vacuum arc evaporation source is desirable because of high ionization rate and a fast etching speed.

In this case, the element forming the interlayer is used as a target. For example, if such a metal as Ti, Cr and Si is used for the interlayer, these metals can be used for targets. If a metallic carbide is used for the interlayer, the metallic carbide may be used for targets. If a metal is used for the target, hydrocarbon gas such as $CH_4$ is supplied into the chamber as a carbon source, or using the metallic target, a metallic layer is formed on the substrate surface during ion irradiation and the metallic layer is carbonized during formation of the amorphous carbon film as described below to form a metallic carbide layer.

In order to simultaneously carry out etching of the substrate surface and formation of the interlayer, it is necessary to suitably select the value of the negative bias voltage applied to the substrate and the pressure of atmosphere. Although these conditions vary according to the ion irradiation method, if e.g. a vacuum arc deposition source is used, the negative bias voltage applied to the substrate should be −300V or over and −1500V or under and the pressure of atmosphere should be 0.133 Pa or under.

During formation of the amorphous carbon film, or at least during the initial period of its formation, an interlayer of a metallic carbide can be formed by irradiating the surface of the metallic interlayer with high-energy carbon ions to carbonize the metallic interlayer. Although these conditions vary with the method of forming the amorphous carbon film, if vacuum arc deposition is used, the negative bias voltage applied to the substrate should be −50V or over and the pressure of atmosphere should be 0.7 Pa or under.

It can be confirmed whether or not the ion irradiation treatment is under the conditions for forming the interlayer simultaneously with the etching of the substrate surface, by confirming that the substrate has been etched after only ion irradiation has been carried out for a long time under the conditions and that an interlayer having a composition and thickness within the range of the present invention has been formed at the interface of the substrate and the amorphous carbon film, by the evaluation of cross sections of specimens on which an amorphous carbon film has been formed, by a transmission electron microscope or by the composition analysis in a depth direction using an X-ray photoelectron spectroscopy or an Auger electron spectroscopy.

In the present invention, a ceramics layer may be formed on the substrate as described below. In this case, too, the interlayer can be formed on the ceramics layer on the substrate by a method similar to the one mentioned above.

As a method of forming an amorphous carbon film, any known method may be used such as plasma CVD, sputter deposition, ion plating or vacuum arc deposition. Among them, sputter deposition and vacuum arc deposition are especially preferable because with these methods, an amorphous carbon film can be formed which is suitable for application to machine parts, molds, cutting tools, etc. because of good wear resistance and high hardness. Also, because these methods are high in the ionization rate of the carbon material and form a film under a relatively low atmospheric pressure, the energy of ions of carbon material that reach the substrate is so high that due to the effect of driving ions into the interlayer, an amorphous carbon film can be formed which has a high adhesive force.

In the present invention, it is necessary to carry out continuously ion irradiation treatment, formation of the interlayer, and formation of the amorphous carbon film in the same vacuum chamber, or to provide vacuum feed paths between a vacuum chamber for ion irradiation, a vacuum chamber for forming the interlayer, and a vacuum chamber for forming the amorphous carbon film, thereby treating continuously in vacuum. This is because if the ion-irradiated substrate is exposed to the atmosphere before the formation of the interlayer, contamination due to oxidation of the substrate surface or interlayer surface or adsorption of molecules develops, so that the effect of ion irradiation or formation of the interlayer would be lost.

Preferably, the amorphous carbon film of the present invention has a Knoop hardness (Hv) of 1200 or over and 8000 or under. If lower than 1200, the wear resistance would be so low that application would be limited. If higher than 8000, the internal stress of the film would be too high, so that the film tends to peel off.

Hardness may be measured by a push-in arrangement. Using a diamond Knoop indenter, with the load set at 50 g and the loading time at 10 seconds, the average value of measured values at ten points was obtained. If the shape of dents is difficult to see because protrusions and recesses on the film surface are large, buff polishing may be carried out with #8000 diamond paste for easy observation of the shape of the dents.

The thickness of the amorphous carbon film is preferably 0.05 $\mu$m or over and 10 $\mu$m or under. If thinner than 0.05 $\mu$m, it would not exhibit properties of amorphous carbon itself such as low friction coefficient and high hardness. If thicker than 10 $\mu$m, the surface roughness of the film would be too rough, so that the friction coefficient tends to increase or the film is liable to peel. Thus it is not suitable for practical use.

Since the amorphous carbon covered member of the present invention is characterized by high adhesion to the substrate, it is suited for applications in which durability is required at high loads of 9.8 Mpa or over such as cutting tools, molds and machine parts. It is not used in applications in which the load range is at a light load such as for magnetic recording media. As machine parts, it is especially suitable for parts for which a low friction coefficient and high durability are required, such as valve-train parts such as cams and valve lifters in internal combustion engines.

The present invention includes a structure in which a ceramics layer is formed between the substrate and the interlayer. This structure is especially effective in applications in which wear resistance is particularly required such as for cutting tools and molds. As the ceramics layer, it is possible to use a nitride of at least one element selected from elements in the IVa, Va, VIa and IIIb groups in the periodic table such as TiN, ZrN, VN, CrN, AlN or TiAlN, a carbide of at least one element selected from elements in the IVa, Va, VIa and IIIb groups in the periodic table such as TiC, or a carbonitride of at least one element selected from elements in the IVa, Va, VIa and IIIb groups in the periodic table such as TiCN.

Since these substances are superior in wear resistance, by using a structure in which one of these substances is disposed between the substrate and the interlayer, an amorphous carbon covered member can be provided which has superior wear resistance besides low friction coefficient, high weld resistance and high seizure resistance of the amorphous carbon film. If an amorphous carbon film is directly formed on such a ceramics layer or if an interlayer employed in the prior art is used, no sufficient adhesion is obtained. But by using the interlayer according to the present invention, it is possible to obtain an extremely high adhesion even on such a ceramics layer.

The ceramics layer may be either a single-layer film of one substance selected from the abovementioned substances, or a laminated structure in which two or more substances are laminated in a plurality of layers.

As the materials used for the ceramics layer, among the above-described ones, TiAlN, ZrN or VN is especially preferable because they are especially superior in the adhesion to the interlayer. If the ceramics layer has a laminated structure, these substances are preferably used for the uppermost layer of the ceramics layer because an especially excellent adhesion is obtained.

The thickness of the ceramics layer is preferably 0.2 $\mu$m or over and less than 5 $\mu$m. If less than 0.2 $\mu$m, the wear resistance would not be improved. Over this range, the ceramics layer tends to peel off the substrate. More preferably, the thickness of the ceramics layer is 0.5 $\mu$m or over and less than 3 $\mu$m.

As a method of forming the ceramics layer, any known method such as plasma CVD, sputter deposition, ion plating or vacuum arc deposition may be used.

As the material of the substrate used in the present invention, any material may be used. But at least one selected from ceramics, iron-family alloys, aluminum alloys and iron-family sintered materials is preferable. As ceramics, silicon nitride, aluminum nitride, alumina, zirconia, silicon carbide, etc. can be cited. As iron-family alloys, high-speed steel, stainless steel, and SKD can be cited. As aluminum alloys, duralumin can be cited. Further, a cemented carbide of a tungsten carbide family metal, a diamond sintered material or a cubic boron nitride sintered material may be used according to the intended use.

The amorphous carbon covered member according to the present invention can be used for cutting tools, molds, machine parts, etc.

Other features and objects of the present invention will become apparent from the following description made with reference to the accompanying drawings, in which:

DETAILED DESCRIPTION OF THE PREFERRED EMBODIMENT

Hereinbelow, embodiments of the present invention will be described.

(Example 1)

Figure 1:
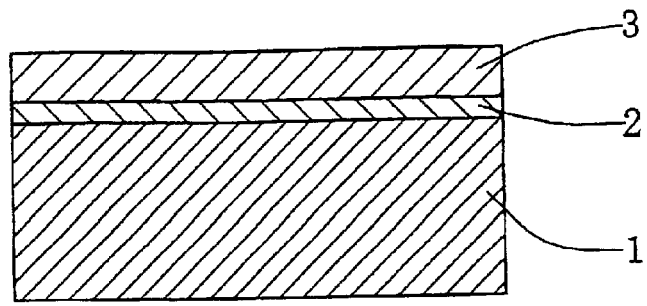
FIG. 1 is a schematic view showing the structure of an amorphous carbon covered member described in Examples 1, 2, 11 and 13.

After an interlayer 2 formed of an element selected from the group consisting of elements in the IVa, Va, VIa and IIIb groups in the periodic table and elements in the IVb group except carbon had been formed on a substrate 1 that had been subjected to ion irradiation treatment, an amorphous carbon film 3 was formed to manufacture an amorphous carbon covered member as shown in FIG. 1. For the substrate 1, tungsten carbide-family cemented carbide K10 (under JIS standard), SUS304, SCM415 and SKD11 were used. After subjected to ultrasonic cleaning in acetone for 10 minutes or over to clean the surface, the substrate 1 was mounted on a substrate holder in a vacuum chamber.

Ion irradiation treatment, formation of the interlayer 2 and formation of the amorphous carbon film 3 were continuously carried out using the same film deposition system. As methods of forming the interlayer 2, ion plating, sputter deposition or vacuum arc deposition was used. As methods of forming the amorphous carbon film 3, a radiofrequency plasma CVD, sputter deposition or vacuum arc deposition were used.

Figure 2:
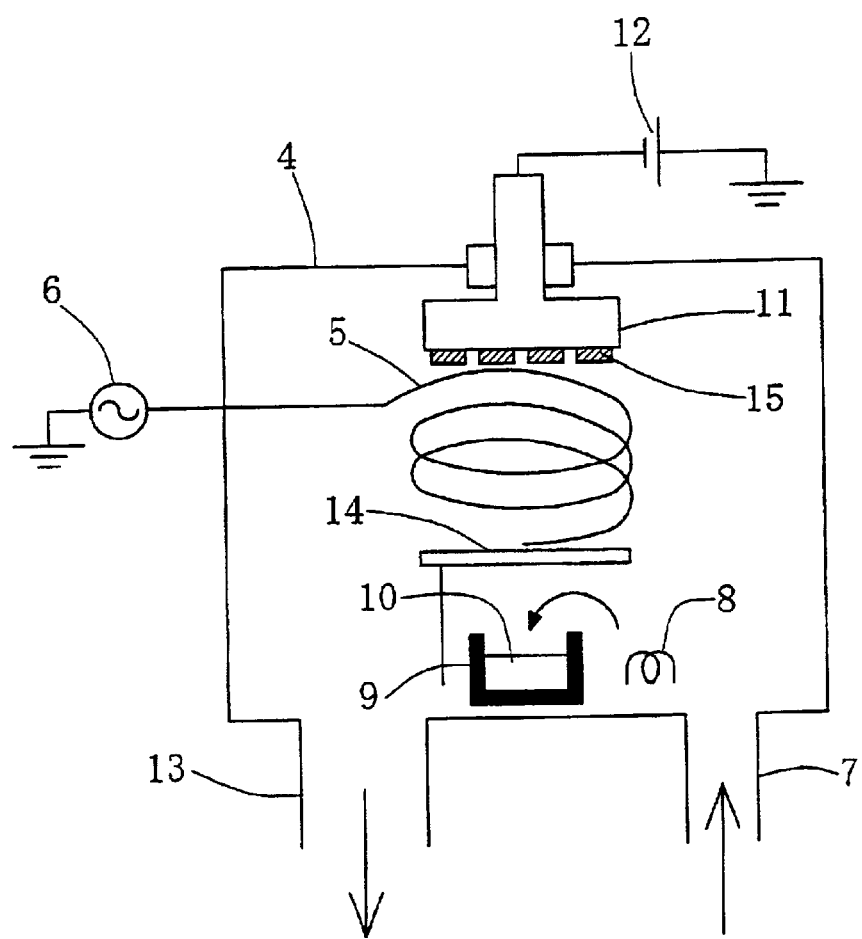
FIG. 2 is a schematic view of an ion plating system.

An ion plating system is shown in FIG. 2. By inputting a radiofrequency power into a radiofrequency coil 5 from a radiofrequency power source 6, an atmospheric gas introduced through a gas inlet 7 is turned into a plasma state. A solid material 10 in a crucible 9 is heated by electron beams produced from a filament 8 to evaporate the solid material. The evaporated material is ionized by a plasma in the atmospheric gas. A direct-current power source 12 is connected to a substrate holder 11 so that a negative bias can be applied. The interior of the vacuum chamber can be vacuum-evacuated through an exhaust port 13.

The ion irradiation, forming the interlayer 2 and forming the amorphous carbon film 3 by means of the ion plating system are described below. As the solid material 10, Zr, Hf or Nb was used. After setting the substrate 15 on the substrate holder 11, the interior of the system was vacuum-evacuated through the gas exhaust port 13 to 0.002 Pa or below. As the atmospheric gas, Ar was introduced through the gas inlet 7 so that the pressure in the vacuum chamber 4 would be 0.05 Pa. Thereafter, a radiofrequency power of 400W was applied to the radiofrequency coil 5 to produce a radiofrequency plasma. With a bias of −1200V applied to the substrate holder 11, the solid material 10 was evaporated by electron beams and a shutter 14 was opened to ionize the evaporated solid material in the plasma. Due to collision of gas ions and zr, Hf or Nb ions against the substrate 15, contamination and oxide layer on the surface of the substrate are etched and removed.

Thereafter, the bias was reduced to −100V to form an interlayer 2 of Zr, Hf or Nb. After vacuum-evacuating the interior of the vacuum chamber 4, CH$_4$ gas was introduced through the gas inlet 7 so that the pressure in the vacuum chamber 4 would be 0.07 Pa. By applying a bias voltage of −500V to the substrate holder 11 and inputting a radiofrequency power of 400W to the radiofrequency coil 5, the amorphous carbon film 3 was formed.

Figure 3:
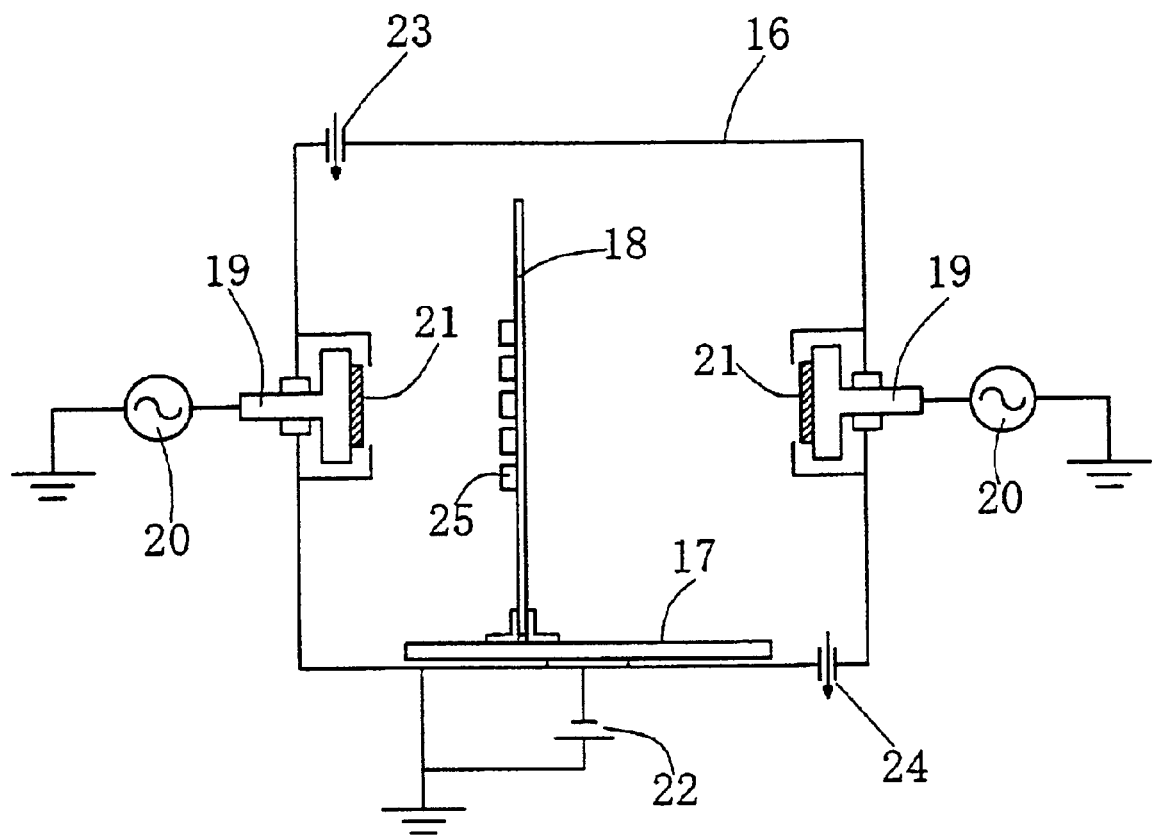
FIG. 3 is a schematic view of a sputter deposition system.

The sputter deposition system used is shown in FIG. 3. It has a turntable 17 in the shape of a horizontal disk in a vacuum chamber 16, and a substrate holder 18 vertically fixed to the turntable 17. Sputter evaporation sources 19 are mounted on side walls of the vacuum chamber between which is disposed the substrate holder 18. Each sputter evaporation source 19 is connected to a radiofrequency power source 20. A target 21 is mounted on each sputter evaporation source 19. Also, a predetermined negative bias voltage can be applied to the substrate holder 18 from a direct-current source 22 connected to the turntable 17. The vacuum chamber 16 is provided with a gas inlet 23 and a gas exhaust port 24.

Ion irradiation, forming the interlayer and forming the amorphous carbon film by use of the sputter evaporation sources are described below. Using the sputter evaporation system shown in FIG. 3, one of the sputter evaporation sources 19 was used for ion irradiation and the formation of the interlayer 2 and the other for the formation of the amorphous carbon film 3. For the target 21 for ion irradiation and formation of the interlayer 2, Ta, Mo, W or Si was used. For the target 21 for forming the amorphous carbon film 3, solid carbon was used.

After setting the substrate 25 on the substrate holder 18, the interior of the vacuum chamber 16 was vacuum-evacuated through the gas exhaust port 24 to 0.002 Pa or below. Argon gas was introduced through the gas inlet 23 so that the pressure in the vacuum chamber 16 was 1 Pa. Thereafter, a bias of −800V was applied to the substrate holder 18 while rotating the turntable 17 at 5 rpm. At the same time, a radiofrequency power of 400W was inputted to the sputter evaporation source 19 for ion irradiation to sputter and ionize the target 21 to collide gas ions and ions of the target element against the substrate 25, thereby etching and removing contamination and oxide layer on the surface of the substrate 1.

Thereafter, the bias was reduced to −150V to form an interlayer 2 of Ta, Mo, W or Si. After vacuum-evacuating the interior of the vacuum chamber 16, $CH_4$ gas and argon gas were introduced through the gas inlet 23 so that the pressure in the vacuum chamber 16 was 1 Pa. The partial pressures of $CH_4$ gas and argon gas were 0.3 Pa and 0.7 Pa, respectively. By inputting a radiofrequency power of 400W to the sputter evaporation source 19 carrying a target of solid carbon and applying a bias voltage of −100V to the substrate holder 18 while rotating the turntable 17 at 5 rpm, an amorphous carbon film 3 was formed.

Figure 4:
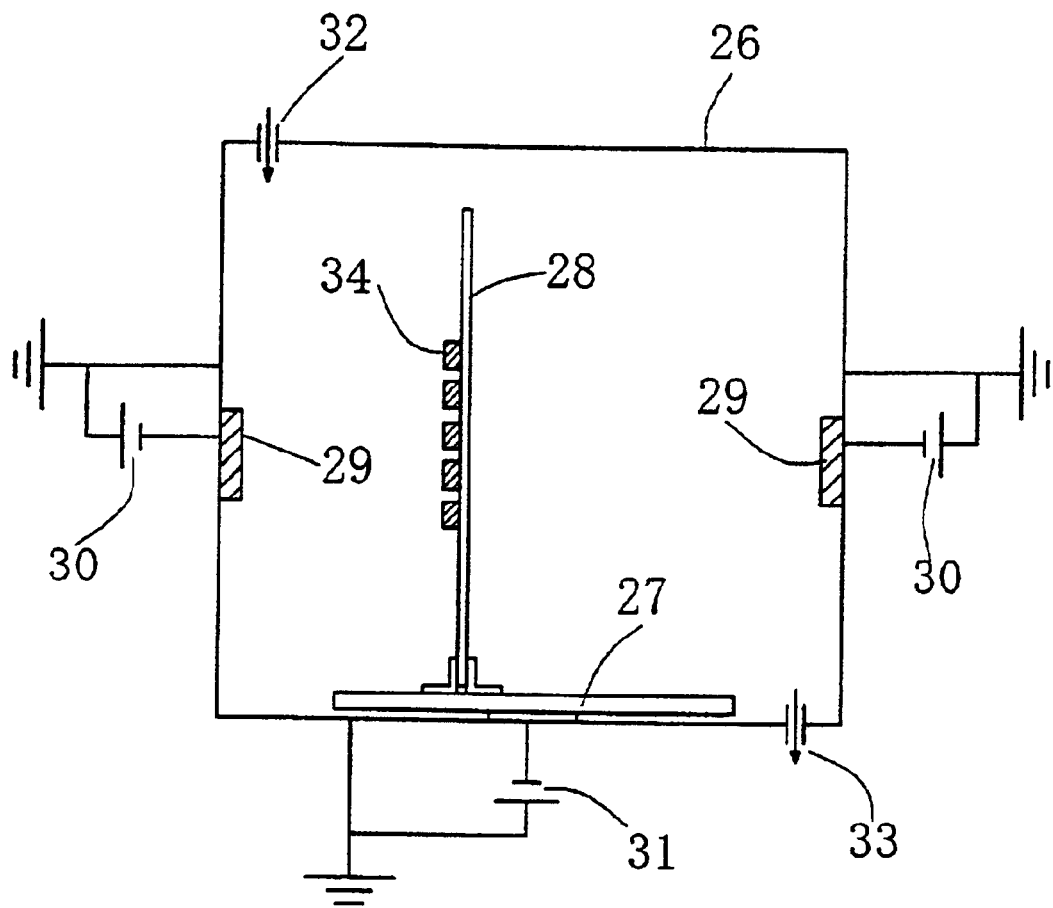
FIG. 4 is a schematic view of a vacuum arc deposition system.

The vacuum arc deposition system used is shown in FIG. 4. It has a turntable 27 in the shape of a horizontal disk in the vacuum chamber 26, and a substrate holder 28 vertically fixed to the turntable 27. Targets 29 (which were vacuum arc evaporation sources) were mounted on side walls of the vacuum chamber 26 between which is disposed the substrate holder 28. Each target 29 is connected to a direct-current source 30. Also, a predetermined negative bias voltage can be applied from a direct-current source 31 connected to the turntable 27, to the substrate holder 28. The vacuum chamber 26 is provided with a gas inlet 32 and a gas exhaust port 33.

Ion irradiation, forming the interlayer 2 and forming the amorphous carbon film 3 by use of the vacuum arc deposition system are described below. Using the vacuum arc deposition system shown in FIG. 4, one of the targets 29 was used for ion irradiation and the formation of the interlayer 2 and the other for the formation of the amorphous carbon film 3. For the target 29 for ion irradiation and formation of the interlayer 2, Ti, V or Cr was used. For the target 29 for forming the amorphous carbon film 3, solid carbon was used. As an atmosphere for ion irradiation, argon gas was introduced through the gas inlet 32.

After setting a substrate 34 on the substrate holder 28, the interior of the system was vacuum-evacuated through the gas exhaust port 33 to 0.002 Pa or below. An atmospheric gas was introduced to 0.7 Pa. Thereafter, a bias of −1200V was applied to the substrate holder 28 while rotating the turntable 27 at 5 rpm. At the same time, arc discharge was produced by passing an arc current of 50A to the target 29 to collide gas ions and ions of the target element against the substrate 34, thereby etching and removing contamination and oxide layer on the surface of the substrate 34. Thereafter, the bias to the substrate was reduced to −800 V to form an interlayer 2 of Ti, V or Cr.

Thereafter, by introducing argon gas through the gas inlet 32 so that the pressure in the vacuum chamber 26 was 1 Pa, applying a bias voltage of −100V to the substrate holder 28, and passing a cathode current of 50A through the solid carbon target to produce arc discharge while rotating the turntable 27 at 5 rpm, an amorphous carbon film 3 was formed.

For the measurement of hardness of the amorphous carbon film 3, a Knoop indenter of diamond was used. With the load at 50 g and the loading time set at 10 seconds, an average value of measured values at ten points was employed. When the shapes of dents were difficult to see because protrusions and recesses on the film surface were large, buff polishing was carried out with a #8000 diamond paste for easy observation of the shapes of the dents.

The adhesion of the amorphous carbon film 3 was evaluated in a Rockwell peel test and a striking test. For the Rockwell peel test, by use of a diamond indenter for measuring the Rockwell C-scale hardness, the peel state around dents formed by pressing the indenter from the film surface under a test load of 150 kgf was observed under an optical microscope. Measurement was carried out five times for each specimen.

In the striking test, by use of a ball of tungsten carbide-family cemented carbide having a diameter of one inch, the surface of each specimen on which was formed a film was struck 400 times under the work amount of 10J, and the striking marks and the peel state therearound were observed under an optical microscope.

The structures and evaluation results of the interlayer 2 and the amorphous carbon film 3 are shown in Table 1. The thickness of the interlayer 2 was determined from a transmission electron microscopic image of cross sections of the specimen. In any of the structures, no peeling was observed either in the Rockwell peel test or the striking test. The amorphous carbon films 3 having the structure according to the present invention showed good adhesion to the substrate 1.

(Example 2)

After an interlayer 2 formed of a carbide of at least one element selected from the group consisting of elements in the IVa, Va, VIa and IIIb groups in the periodic table and elements in the IVb group except carbon had been formed on a substrate 1 that had been subjected to ion irradiation treatment, an amorphous carbon film 3 was formed. The substrate 1 was the same as the one used in Example 1 and was mounted on a substrate holder in a vacuum chamber after cleaning in the same manner as in Example 1.

Methods for ion irradiation, formation of the interlayer and formation of the amorphous carbon film were the same as in Example 1.

The ion irradiation, forming the interlayer 2 and forming the amorphous carbon film 3 by means of an ion plating system are described below. Using Zr, Hf or Nb as the material 10, ion irradiation treatment was carried out in the same manner as in Example 1. After vacuum-evacuating the interior of the vacuum chamber 4, by introducing $CH_4$ gas so that the pressure in the vacuum chamber 4 was 0.1 Pa, and applying a bias voltage of −200 V to the substrate holder 11 to evaporate Zr, Hf or Nb in the crucible 9, an interlayer 2 of ZrC, HfC or NbC was formed. Thereafter, in the same manner as in Example 1, an amorphous carbon film was formed on the interlayer.

Ion irradiation forming the interlayer 2 and forming the amorphous carbon film 3 by means of a sputter deposition system are described below. For the target 21 for ion irradiation and formation of the interlayer 2, Ta, Mo, W or Si was used. For the target 21 for forming the amorphous carbon film 3, solid carbon was used. After carrying out ion irradiation in the same manner as in Example 1, the interior of the vacuum chamber 16 was vacuum-evacuated, and $CH_4$ gas and argon gas were introduced so that the pressure in the vacuum chamber 16 was 1 Pa. The partial pressures of $CH_4$ gas and argon gas were 0.3 Pa and 0.7 Pa, respectively. By inputting a radiofrequency power of 400W to the sputter evaporation source 19 to which was mounted a target of Ta, Mo, W or Si, and applying a bias voltage of −150V to the substrate holder 18 while rotating the turntable 17 at 5 rpm, an interlayer of TaC, MoC, WC or SiC was formed. Thereafter, in the same manner as in Example 1, an amorphous carbon film 3 was formed on the interlayer 2.

Ion irradiation, forming the interlayer 2 and forming the amorphous carbon film 3 by means of a vacuum arc deposition system are described below. For the target 21 for ion irradiation and formation of the interlayer 2, Ti, V or Cr was used. For the target 21 for forming the amorphous carbon film 3, solid carbon was used. After carrying out ion irradiation in the same manner as in Example 1, the interior of the vacuum chamber 26 was vacuum-evacuated, and $CH_4$ gas and argon gas were introduced so that the pressure in the vacuum chamber 26 was 2 Pa. The partial pressures of $CH_4$ gas and argon gas were 1 Pa and 1 Pa, respectively. By applying a bias of −200V to the substrate holder 28 while turning the turntable 27 at 5 rpm and passing an arc current of 50A to the target for forming the interlayer to produce arc discharge, an interlayer of TiC, VC or $CrC_x$ was formed. Thereafter, in the same manner as in Example 1, an amorphous carbon film 3 was formed on the interlayer 2.

For the specimens formed, in the same manner as in Example 1, the adhesion of the amorphous carbon film 3 was evaluated in the Rockwell peel test and the striking test.

The structures and evaluation results of the interlayer 2 and the amorphous carbon film 3 are shown in Table 2. The thickness of the interlayer 2 was determined from a transmission electron microscopic image of cross sections of the specimen. In any of the structures, no peeling was observed either in the Rockwell peel test or the striking test. The amorphous carbon films having the structure according to the present invention showed good adhesion to the substrate.

(Comparative Example 1)

In the same manner as in Examples 1 and 2, an interlayer of Nb, Mo, Ti, ZrC, TaC or $CrC_x$ was formed on a substrate that had been subjected to ion irradiation treatment, by ion plating, sputter deposition or vacuum arc deposition. An amorphous carbon film 3 was formed on the interlayer 2 by plasma CVD, sputter deposition or vacuum arc deposition. But the film thickness of the interlayer 2 was out of the range defined in the present invention.

The structures and evaluation results of the interlayer 2 and the amorphous carbon film 3 are shown in Table 3. Unlike Examples of the present invention, both in the Rockwell peel test and striking test, peeling of the amorphous carbon film 3 was observed, and the adhesion to the substrate was poor.

(Example 3)

An interlayer 2 and an amorphous carbon film 3 were formed on the outer periphery of a plunger of stainless steel by the method of Example 1-3 and the method of Comparative Example 1-1. For the plunger in which an amorphous carbon film 3 was formed by the method of Comparative Example 1-1, peeling of the film occurred after operation for one hour. But for the plunger in which an amorphous carbon film 3 was formed by the method of Examples 1–3, no peeling of the film occurred even after a 10000-hour operation.

(Example 4)

An interlayer 2 and an amorphous carbon film 3 were formed on the sliding surface of a cam of an engine part by the methods of Example 1-5 and Comparative Example 1-2, and a motoring test was conducted with a camshaft revolving speed of 2500 rpm and a spring load of 882 N. For the amorphous carbon film 3 formed by the method of Comparative Example 1-2, peeling occurred after a 30-minute operation, whereas for the one formed by the method of Example 1-5, no peeling occurred even after a 300-hour operation.

(Example 5)

An interlayer 2 and an amorphous carbon film 3 were formed on the outer periphery of a shaft made of SUJ2 by the methods of Example 1-8 and Comparative Example 1-3. When they were used in combination with a bearing made of SUJ2, for the amorphous carbon film formed by the method of Comparative Example 1-3, peeling occurred after it was used for one hour, but for the one formed by the method of Example 1-8, no peeling occurred even after it was used 200 hours.

(Example 6)

An interlayer 2 and an amorphous carbon film 3 were formed on a drill made of a tungsten carbide-family cemented carbide (K10 under JIS standard) by the methods of Example 2-1 and Comparative Example 1-4. When an aluminum material was drilled by use of the drills, for the amorphous carbon film formed by the method of Comparative Example 1-4, peeling occurred after drilling over a length of 1 km, but for the amorphous carbon film formed by the method of Example 2-1, no peeling occurred even after drilling for 20 km.

(Example 7)

An interlayer 2 and an amorphous carbon film 3 were formed on the surface of a mold for bending a lead frame made of SKD11 by the methods of Example 2-4 and Comparative Example 1-5 and used to bend a lead frame. For the amorphous carbon film formed by the method of Comparative Example 1-5, weld of solder plating due to peeling of the film occurred after 5000 shots, but for the one formed by the method of Example 2-4, no weld of solder plating due to peeling of the film occurred up to 200000 shots.

(Example 8)

Figure 5:
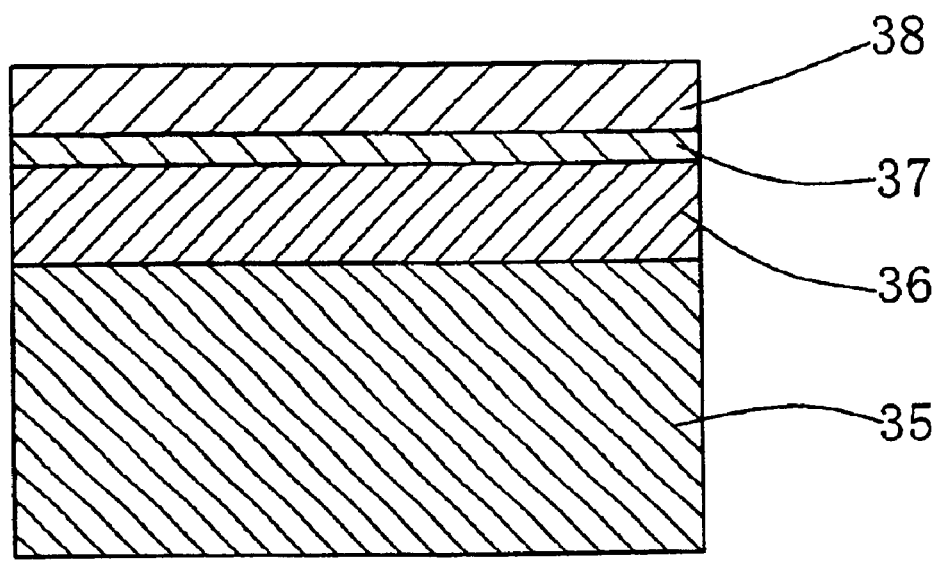
FIG. 5 is a schematic view showing the structure of an amorphous carbon covered member described in Examples 8, 12 and 14.

Using the same one as used in Example 1 as the substrate 35, after cleaning in the same manner as in Example 1, a ceramics layer 36 was formed by a known vacuum arc deposition (FIG. 5). After carrying out ion irradiation treatment, an interlayer 37 was formed which comprised an element in the IVa, Va, VIa or IIIb group in the periodic table and in the IVb group except carbon or their carbides. An amorphous carbon film 38 was then formed to manufacture the amorphous carbon covered member shown in FIG. 5.

Methods of ion irradiation treatment, formation of the interlayer 37 and formation of the amorphous carbon film 38 were the same as in Examples 1 and 2.

For the specimens thus formed, adhesion of the amorphous carbon film 38 was evaluated by the Rockwell peeling test and the striking test in the same manner as in Examples 1 and 2.

The structures and evaluation results of the ceramic layer 36, interlayer 37 and amorphous carbon film 38 are shown in Table 4. The thickness of the interlayer 37 was determined from a transmission electron microscopic image of cross sections of specimen. For any of the structures, no peeling was observed either in the Rockwell peel test or the striking test, and the amorphous carbon film 38 having the structure according to the present invention exhibited good adhesion to the substrate 35.

(Comparative Example 2)

In the same manner as in Example 8, on a substrate formed with a ceramics layer 36 and subjected to ion irradiation, an interlayer 37 of Nb, Mo, Ti, ZrC, TaC or CrCx was formed by ion plating, sputter deposition or vacuum arc deposition, and an amorphous carbon film 38 was formed on the interlayer 37 by plasma CVD, sputter deposition or vacuum arc deposition. But the film thickness of the interlayer 37 was out of the range of the present invention.

The structures and evaluation results of the interlayer 37 and the amorphous carbon film 38 are shown in Table 5. Unlike Examples of the present invention, both in the Rockwell peel test and striking test, peeling of the amorphous carbon film occurred, and adhesion to the substrate 35 was poor.

(Example 9)

An interlayer 2 and an amorphous carbon film 3 were formed on an insert for machining an aluminum alloy, to which was brazed a diamond sintered body, by the methods of Example 2-10 and Comparative Example 1-6. An aluminum alloy (JIS ADC12) was milled by use of the specimens obtained. For the amorphous carbon film 3 formed by the method of Comparative Example 1-6, peeling occurred after cutting by 1 km, but for the amorphous carbon film 3 formed by the method of Example 2-10, no peeling occurred even after continuous cutting by 40 km.

(Example 10)

An interlayer 2 and an amorphous carbon film 3 were formed on an indexable insert for hard turning, to which was brazed a cubic boron nitride sintered member, by the methods of Example 2-10 and Comparative Example 1-6. High-speed continuous cutting of case-hardened steel (JIS SCM415) was carried out by use of the specimens obtained. For the amorphous carbon film 3 formed by the method of Comparative Example 1-6, peeling occurred after cutting for one minute, whereas for the amorphous carbon film 3 formed by the method of Example 2-10, no peeling occurred even after continuous cutting for 30 minutes.

(Example 11)

After by ion irradiation treatment of the substrate 1, a metallic interlayer 2 had been formed simultaneously with the cleaning of the substrate surface, an amorphous carbon film 3 was formed on the interlayer to manufacture an amorphous carbon covered member as shown in FIG. 1. As the substrate 1, one similar to that used in Example 1 was used. After cleaning as in Example 1, it was mounted on a substrate holder in a vacuum chamber.

Ion irradiation treatment and formation of the amorphous carbon film 3 were carried out by vacuum arc deposition as in Example 1. For the targets 29 for ion irradiation, Ti, Cr, Zr and V were used. Ion irradiation was carried out without introducing any gas through the gas inlet with the ultimate vacuum at 0.002 Pa or under. Ion irradiation was carried out with the bias set at −1000V and the arc current at 50A while rotating the turntable 27 at a speed of 5 rpm. Thereafter, the amorphous carbon film 3 was formed in the same manner as in Example 1.

For the specimens made, adhesion of the amorphous carbon film 3 was evaluated by a Rockwell peel test and a striking test in the same manner as in Example 1.

The structures and evaluation results of the targets used for ion irradiation, interlayer 2 and amorphous carbon film 3 are listed in Table 6. The thickness and composition of the interlayer 2 were determined from transmission electron microscopic images of cross sections of the specimens and the composition analysis of each section in a depth direction by X-ray photoelectron spectroscopy.

For any specimen, it was confirmed that an interlayer 2 comprising the same element as the material of target used for ion irradiation had been formed by ion irradiation. Also, it was confirmed that when only ion irradiation was carried out for one hour under the same ion irradiation conditions, the substrate was etched and etching cleaning of the substrate and formation of the interlayer occurred simultaneously by ion irradiation. In any of these structures, no peeling was observed both in the Rockwell peel test and the striking test. The amorphous carbon film 3 having the structure according to the present invention exhibited good adhesion to the substrate.

(Example 12)

A substrate on which was formed a ceramics layer 36 in the same manner as in Example 8 was subjected to ion irradiation treatment as in Example 11. After a metallic interlayer 37 had been formed simultaneously with the cleaning of the substrate surface, an amorphous carbon film 38 was formed on the interlayer to manufacture an amorphous carbon covered member as shown in FIG. 5.

The structures and evaluation results of the targets used for ion irradiation, ceramics layer 36, interlayer 37 and amorphous carbon film 38 are listed in Table 7. The thickness and composition of the interlayer 37 were determined from transmission electron microscopic images of cross sections of the specimens and the composition analysis of each section in a depth direction by X-ray photoelectron spectroscopy. For any specimen, it was confirmed that an interlayer 37 comprising the same elements as the target materials used for ion irradiation was formed by ion irradiation.

Also, it was confirmed that when only ion irradiation was carried out for one hour under the same ion irradiation conditions, the ceramics layer was etched, and that etching cleaning of the ceramics layer and formation of the interlayer occurred simultaneously by ion irradiation. In any of these structures, no peeling was observed both in the Rockwell peel test and the striking test. The amorphous carbon film 38 having the structure of the present invention exhibited good adhesion to the substrate.

(Example 13)

In the same manner as in Example 11, a metallic layer was formed on the substrate surface simultaneously with cleaning of the substrate surface by ion irradiation to the substrate 1. Thereafter, by forming an amorphous carbon film 3 in the following manner, an amorphous carbon covered member, the interlayer 2 of which was a metallic carbide was manufactured.

Formation of the amorphous carbon film was carried out without introducing any gas through the gas inlet with the ultimate vacuum set at 0.002 Pa or under. The amorphous carbon film 3 was formed with the bias set at −100V and the arc current at 50A while rotating the turntable 27 at a speed of 5 rpm.

For the specimens obtained, adhesion of the amorphous carbon film 3 was evaluated by a Rockwell peel test and a striking test as in Example 1.

The structures and evaluation results of the targets used for ion irradiation, interlayer 2 and amorphous carbon film 3 are listed in Table 8. The thickness and composition of the interlayer 2 were determined from transmission electron microscopic images of cross sections of the specimens and the composition analysis of each section in a depth direction by X-ray photoelectron spectroscopy.

For any specimen, it was confirmed that an interlayer 2 comprising a carbide of the same metallic element as the target material used for ion irradiation was formed by ion irradiation. Also, it was confirmed that when only ion irradiation was carried out for one hour under the same ion irradiation conditions, the substrate was etched, and that etching cleaning of the substrate and formation of the metallic layer occurred simultaneously by ion irradiation. In any of these structures, no peeling was observed both in the Rockwell peel test and the striking test. The amorphous carbon film 3 having the structure according to the present invention exhibited good adhesion to the substrate.

(Example 14)

On a substrate on which was formed a ceramics layer 36 in the same manner as in Example 8, ion irradiation treatment and the formation of an amorphous carbon film 38 were carried out in the same manner as in Example 13 to manufacture an amorphous carbon covered member as shown in FIG. 5.

The structures and evaluation results of the targets used for ion irradiation, ceramic layer 36, interlayer 37, and amorphous carbon film 38 are listed in Table 9. The thickness and composition of the interlayer 37 were determined from transmission electron microscopic images of cross sections of the specimens and the composition analysis of each section in a depth direction by x-ray photoelectron spectroscopy. For any specimen, it was confirmed that an interlayer 37 comprising the same element as the target material used for ion irradiation was formed by ion irradiation.

Also, it was confirmed that when only ion irradiation was carried out for one hour under the same ion irradiation conditions, the ceramics layer was etched, and that etching cleaning of the ceramics layer and formation of the interlayer occurred simultaneously by ion irradiation treatment. In any of these structures, no peeling was observed both in the Rockwell peel test and the striking test, and the amorphous carbon film 38 having the structure according to the present invention exhibited good adhesion to the substrate.

As described above, by using the structure according to the present invention, an amorphous carbon covered member can be obtained which is superior in the adhesion to the substrate. It is applicable to machine parts, tools and molds.

TABLE 1

| | Interlayer | | | Amorphous carbon film | | | | Evaluation results | |
|---|---|---|---|---|---|---|---|---|---|
| | Material | Film deposition method | Film thickness (nm) | Film deposition method | Film thickness ($\mu$m) | Knoop hardness | Substrate | Rockwell peel test | Striking test |
| Example 1-1 | Zr | Ion plating | 2 | Plasma CVD | 2.0 | 1200 | K10 | No peeling | No peeling |
| Example 1-2 | Hf | Ion plating | 3 | Plasma CVD | 2.0 | 1200 | SUS304 | No peeling | No peeling |
| Example 1-3 | Nb | Ion plating | 5 | Plasma CVD | 2.0 | 1200 | SCM415 | No peeling | No peeling |
| Example 1-4 | Ta | Sputter deposition | 0.5 | Sputter deposition | 0.8 | 2500 | SKD11 | No peeling | No peeling |
| Example 1-5 | Mo | Sputter deposition | 1 | Sputter deposition | 0.8 | 2500 | K10 | No peeling | No peeling |
| Example 1-6 | W | Sputter deposition | 2 | Sputter deposition | 0.8 | 2500 | SUS304 | No peeling | No peeling |
| Example 1-7 | Si | Sputter deposition | 5 | Sputter deposition | 0.8 | 2500 | SCM415 | No peeling | No peeling |
| Example 1-8 | Ti | Vacuum arc deposition | 9 | Vacuum arc deposition | 1.5 | 3700 | SKD11 | No peeling | No peeling |
| Example 1-9 | V | Vacuum arc deposition | 7 | Vacuum arc deposition | 1.5 | 3700 | K10 | No peeling | No peeling |
| Example 1-10 | Cr | Vacuum arc deposition | 5 | Vacuum arc deposition | 1.5 | 3700 | SUS304 | No peeling | No peeling |

TABLE 2

| | Interlayer | | | Amorphous carbon film | | | | Evaluation results | |
|---|---|---|---|---|---|---|---|---|---|
| | Material | Film deposition method | Film thickness (nm) | Film deposition method | Film thickness ($\mu$m) | Knoop hardness | Substrate | Rockwell peel test | Striking test |
| Example 2-1 | ZrC | Ion plating | 3 | Plasma CVD | 2.0 | 1200 | K10 | No peeling | No peeling |
| Example 2-2 | HfC | Ion plating | 5 | Plasma CVD | 2.0 | 1200 | SUS304 | No peeling | No peeling |

TABLE 2-continued

| | | Interlayer | | Amorphous carbon film | | | | Evaluation results | |
|---|---|---|---|---|---|---|---|---|---|
| | Material | Film deposition method | Film thickness (nm) | Film deposition method | Film thickness (μm) | Knoop hardness | Substrate | Rockwell peel test | Striking test |
| Example 2-3 | NbC | Ion plating | 7 | Plasma CVD | 2.0 | 1200 | SCM415 | No peeling | No peeling |
| Example 2-4 | TaC | Sputter deposition | 0.7 | Sputter deposition | 0.8 | 2500 | SKD11 | No peeling | No peeling |
| Example 2-5 | MoC | Sputter deposition | 1.5 | Sputter deposition | 0.8 | 2500 | K10 | No peeling | No peeling |
| Example 2-6 | WC | Sputter deposition | 2.5 | sputter deposition | 0.8 | 2500 | SUS304 | No peeling | No peeling |
| Example 2-7 | SiC | Sputter deposition | 4 | Sputter deposition | 0.8 | 2500 | SCM415 | No peeling | No peeling |
| Example 2-8 | TiC | Vacuum arc deposition | 8 | Vacuum arc deposition | 1.5 | 3700 | SKD11 | No peeling | No peeling |
| Example 2-9 | VC | Vacuum arc deposition | 6 | Vacuum arc deposition | 1.5 | 3700 | K10 | No peeling | No peeling |
| Example 2-10 | CrCx | Vacuum arc deposition | 4.5 | Vacuum arc deposition | 1.5 | 3700 | SUS304 | No peeling | No peeling |

TABLE 3

| | | Interlayer | | Amorphous carbon film | | | | Evaluation results | |
|---|---|---|---|---|---|---|---|---|---|
| | Material | Film deposition method | Film thickness (nm) | Film deposition method | Film thickness (μm) | Knoop hardness | Substrate | Rockwell peel test | Striking test |
| Comparative Example 1-1 | Nb | Ion plating | 100 | Plasma CVD | 2.0 | 1200 | SCM415 | peeled | peeled |
| Comparative Example 1-2 | Mo | Sputter deposition | 150 | Sputter deposition | 0.8 | 2500 | K10 | peeled | peeled |
| Comparative Example 1-3 | Ti | Vacuum arc deposition | 200 | Vacuum arc deposition | 1.5 | 3700 | SKD11 | peeled | peeled |
| Comparative Example 1-4 | ZrC | Ion plating | 15 | Plasma CVD | 2.0 | 1200 | K10 | peeled | peeled |
| Comparative Example 1-5 | TaC | Sputter deposition | 0.4 | Sputter deposition | 0.8 | 2500 | SKD11 | peeled | peeled |
| Comparative Example 1-6 | CrCx | Vacuum arc deposition | 50 | Vacuum arc deposition | 1.5 | 3700 | SUS304 | peeled | peeled |

TABLE 4

| | Ceramics layer | | Interlayer | | | Amorphous carbon film | | | | Evaluation results | |
|---|---|---|---|---|---|---|---|---|---|---|---|
| | Material | Film thickness (μm) | Material | Film deposition method | Film thickness (nm) | Film deposition method | Film thickness (μm) | Knoop hardness | Substrate | Rockwell peel test | Striking test |
| Example 8-1 | TiAlN | 1 | Zr | Ion plating | 2 | Plasma CVD | 2.0 | 1200 | K10 | No peeling | No peeling |
| Example 8-2 | ZrN | 2 | Hf | Ion plating | 3 | plasma CVD | 2.0 | 1200 | SUS304 | No peeling | No peeling |
| Example 8-3 | VN | 3 | Nb | Ion plating | 5 | plasma CVD | 2.0 | 1200 | SCM415 | No peeling | No peeling |
| Example 8-4 | TiAlN | 0.2 | Ta | Sputter deposition | 0.5 | Sputter deposition | 0.8 | 2500 | SKD11 | No peeling | No peeling |
| Example 8-5 | CrN | 0.5 | Mo | Sputter deposition | 1 | Sputter deposition | 0.8 | 2500 | K10 | No peeling | No peeling |
| Example 8-6 | TiC | 5 | W | Sputter deposition | 2 | Sputter deposition | 0.8 | 2500 | SUS304 | No peeling | No peeling |
| Example 8-7 | TiCN | 1 | Si | Sputter deposition | 5 | Sputter deposition | 0.8 | 2500 | SCM415 | No peeling | No peeling |
| Example 8-8 | VN | 2 | Ti | Vacuum arc deposition | 9 | Vacuum arc deposition | 1.5 | 3700 | SKD11 | No peeling | No peeling |
| Example 8-9 | ZrN | 3 | V | Vacuum arc deposition | 7 | Vacuum arc deposition | 1.5 | 3700 | K10 | No peeling | No peeling |
| Example 8-10 | TiAlN | 2 | Cr | Vacuum arc deposition | 5 | Vacuum arc deposition | 1.5 | 3700 | SUS304 | No peeling | No peeling |

TABLE 4-continued

| | Ceramics layer | | Interlayer | | Amorphous carbon film | | | | Evaluation results | |
|---|---|---|---|---|---|---|---|---|---|---|
| | Material | Film thickness (μm) | Material | Film deposition method | Film thickness (nm) | Film deposition method | Film thickness (μm) | Knoop hardness | Substrate | Rockwell peel test | Striking test |
| Example 8-11 | TiAlN | 1 | ZrC | Ion plating | 3 | Plasma CVD | 2.0 | 1200 | K10 | No peeling | No peeling |
| Example 8-12 | ZrN | 2 | HfC | Ion plating | 5 | Plasma CVD | 2.0 | 1200 | SUS304 | No peeling | No peeling |
| Example 8-13 | VN | 3 | NbC | Ion plating | 7 | Plasma CVD | 2.0 | 1200 | SCM415 | No peeling | No peeling |
| Example 8-14 | TiAlN | 0.2 | TaC | Sputter deposition | 0.7 | Sputter deposition | 0.8 | 2500 | SKD11 | No peeling | No peeling |
| Example 8-15 | CrN | 0.5 | MoC | Sputter | 1.5 | Sputter | 0.8 | 2500 | K10 | No peeling | No peeling |
| Example 8-16 | TiC | 5 | WC | Sputter deposition | 2.5 | Sputter deposition | 0.8 | 2500 | SUS304 | No peeling | No peeling |
| Example 8-17 | TiCN | 1 | SiC | Sputter | 4 | Sputter | 0.8 | 2500 | SCM415 | No peeling | No peeling |
| Example 8-18 | VN | 2 | TiC | Vacuum arc | 8 | Vacuum arc | 1.5 | 3700 | SKD11 | No peeling | No peeling |
| Example 8-19 | ZrN | 3 | VC | Vacuum arc | 6 | Vacuum arc | 1.5 | 3700 | K10 | No peeling | No peeling |
| Example 8-20 | TiAlN | 2 | CrCx | Vacuum arc | 4.5 | Vacuum arc | 1.5 | 3700 | SUS304 | No peeling | No peeling |

TABLE 5

| | Ceramics layer | | Interlayer | | Amorphous carbon film | | | | Evaluation results | |
|---|---|---|---|---|---|---|---|---|---|---|
| | Material | Film thickness (μm) | Material | Film deposition method | Film thickness (nm) | Film deposition method | Film thickness (μm) | Knoop hardness | Substrate | Rockwell peel test | Striking test |
| Comparative Example 2-1 | VN | 3 | Nb | Ion plating | 100 | Plasma CVD | 2.0 | 1200 | SCM415 | peeled | peeled |
| Comparative Example 2-2 | CrN | 0.5 | Mo | Sputter deposition | 150 | Sputter deposition | 0.8 | 2500 | K10 | peeled | peeled |
| Comparative Example 2-3 | VN | 2 | Ti | Vacuum arc deposition | 200 | Vacuum arc deposition | 1.5 | 3700 | SKD11 | peeled | peeled |
| Comparative Example 2-4 | TiAlN | 1 | ZrC | Ion plating | 15 | Plasma CVD | 2.0 | 1200 | K10 | peeled | peeled |
| Comparative Example 2-5 | TiAlN | 0.2 | TaC | Sputter deposition | 0.4 | Sputter deposition | 0.8 | 2500 | SKD11 | peeled | peeled |
| Comparative Example 2-6 | TiAlN | 2 | CrCx | Vacuum arc deposition | 50 | Vacuum arc deposition | 1.5 | 3700 | SUS304 | peeled | peeled |

TABLE 6

| | Ion irradiation treatment | | Interlayer | | Amorphous carbon film | | | | Evaluation results | |
|---|---|---|---|---|---|---|---|---|---|---|
| | Target Material | Ion generating method | Material | Film thickness (nm) | Film deposition method | Film thickness (μm) | Knoop hardness | Substrate | Rockwell peel test | Striking test |
| Example 11-1 | Ti | Vacuum arc evaporation source | Ti | 1 | Vacuum arc deposition | 1.5 | 3700 | K10 | No peeling | No peeling |
| Example 11-2 | Cr | Vacuum arc evaporation source | Cr | 3 | Vacuum arc deposition | 1.5 | 3700 | SUS304 | No peeling | No peeling |
| Example 11-3 | Zr | Vacuum arc evaporation source | Zr | 4 | Vacuum arc deposition | 1.5 | 3700 | SCM415 | No peeling | No peeling |
| Example 11-4 | V | Vacuum arc evaporation source | V | 6 | Vacuum arc deposition | 1.5 | 3700 | SKD11 | No peeling | No peeling |

TABLE 7

| | Ceramics layer | | Ion irradiation treatment | | Interlayer | | Amorphous carbon film | | | | Evaluation results | |
|---|---|---|---|---|---|---|---|---|---|---|---|---|
| | Material | Film thickness (μm) | Target Material | Ion generating method | Material | Film thickness (nm) | Film deposition method | Film thickness (μm) | Knoop hardness | Substrate | Rockwell peel test | Striking test |
| Example 12-1 | TiAlN | 1 | Ti | Vacuum arc evaporation source | Ti | 1 | Vacuum arc deposition | 1.5 | 3700 | K10 | No peeling | No peeling |
| Example 12-2 | ZrN | 2 | Cr | Vacuum arc evaporation source | Cr | 3 | Vacuum arc deposition | 1.5 | 3700 | SUS304 | No peeling | No peeling |
| Example 12-3 | VN | 3 | Zr | Vacuum arc evaporation source | Zr | 4 | Vacuum arc deposition | 1.5 | 3700 | SCM415 | No peeling | No peeling |
| Example 12-4 | TiCN | 1 | V | Vacuum arc evaporation source | V | 6 | Vacuum arc deposition | 1.5 | 3700 | SKD11 | No peeling | No peeling |

TABLE 8

| | Ion irradiation treatment | | Interlayer | | Amorphous carbon film | | | | Evaluation results | |
|---|---|---|---|---|---|---|---|---|---|---|
| | Target Material | Ion generating method | Material | Film thickness (nm) | Film deposition method | Film thickness (μm) | Knoop hardness | Substrate | Rockwell peel test | Striking test |
| Example 13-1 | Ti | Vacuum arc evaporation source | TiC | 2 | Vacuum arc deposition | 1.5 | 4000 | K10 | No peeling | No peeling |
| Example 13-2 | Cr | Vacuum arc evaporation source | CrCx | 5 | Vacuum arc deposition | 1.5 | 4000 | SUS304 | No peeling | No peeling |
| Example 13-3 | Zr | Vacuum arc evaporation source | ZrC | 6 | Vacuum arc deposition | 1.5 | 4000 | SCM415 | No peeling | No peeling |
| Example 13-4 | V | Vacuum arc evaporation source | VC | 8 | Vacuum arc deposition | 1.5 | 4000 | SKD11 | No peeling | No peeling |

TABLE 9

| | Ceramics layer | | Ion irradiation treatment | | Interlayer | | Amorphous carbon film | | | | Evaluation results | |
|---|---|---|---|---|---|---|---|---|---|---|---|---|
| | Material | Film thickness (μm) | Target Material | Ion generating method | Material | Film thickness (nm) | Film deposition method | Film thickness (μm) | Knoop hardness | Substrate | Rockwell peel test | Striking test |
| Example 14-1 | TiAlN | 1 | Ti | Vacuum arc evaporation source | TiC | 1 | Vacuum arc deposition | 1.5 | 4000 | K10 | No peeling | No peeling |
| Example 14-2 | ZrN | 2 | Cr | Vacuum arc evaporation source | CrCx | 3 | Vacuum arc deposition | 1.5 | 4000 | SUS304 | No peeling | No peeling |
| Example 14-3 | VN | 3 | Zr | Vacuum arc evaporation source | ZrC | 4 | Vacuum arc deposition | 1.5 | 4000 | SCM415 | No peeling | No peeling |
| Example 14-4 | TiCN | 1 | V | Vacuum arc evaporation source | VC | 6 | Vacuum arc deposition | 1.5 | 4000 | SKD11 | No peeling | No peeling |

What is claimed is:

1. An amorphous carbon covered member comprising:
   a substrate;
   an interlayer formed on said substrate, said interlayer comprising at least one element selected from the group consisting of Ti, Zr, Hf Cr, W, Al, Ga, In, Ti, Sn and Pb, and said interlayer having a thickness of 0.5 nm or over and less than 10 nm; and
   an amorphous carbon film formed on said interlayer; and
   said interlayer is formed simultaneously with etching of said surface of said substrate by applying a negative bias voltage to said substrate in presence of at least ions of an element forming said interlayer.

2. The amorphous carbon covered member as claimed in 1 wherein said interlayer is formed by ion plating, sputter deposition or vacuum arc deposition.

3. The amorphous carbon covered member as claimed in claim 1 wherein said interlayer comprises at least one of Ti, Zr, Hf, Cr and W.

4. The amorphous carbon covered member as claimed in claim 1 wherein said amorphous carbon film is formed by sputter deposition or vacuum arc deposition.

5. The amorphous carbon covered member as claimed in claim 1 wherein said amorphous carbon film has a Knoop hardness (Hv) of 1200 or over and 8000 or under.

6. The amorphous carbon covered member as claimed in claim 1 wherein said substrate is at least one of ceramics, iron-base alloys, aluminum alloys, iron-base sintered materials, cemented carbides of tungsten carbide-base metals, diamond sintered materials, and cubic boron nitride sintered materials.

7. The amorphous carbon covered member as claimed in claim 1 wherein the member comprises at least one of cutting tool, mold and machine part.

8. A method of coating amorphous carbon film, comprising applying a negative bias voltage to a substrate having a surface in the presence of ions of at least one element selected from the group consisting of Ti, Zr, Hf, Cr, W, Al, Ga, In, Ti, Sn and Pb to irradiate said ions on the surface of said substrate, thereby etching the surface of said substrate, and simultaneously forming an interlayer comprising said at least one element and having a thickness of 0.5 nm to 10 nm, and coating an amorphous carbon film on a top layer of the interlayer.

9. The method of coating amorphous carbon film as claimed in claim 8 wherein the interlayer is synthesized by ion plating, sputtering or vacuum arc deposition.

10. The method, of coating amorphous carbon film as claimed in claim 9 wherein said amorphous carbon film is formed by sputtering or vacuum arc deposition.

11. The method of coating amorphous carbon film as claimed in claim 8 wherein said amorphous carbon film is formed by sputtering or vacuum arc deposition.

12. An amorphous carbon covered member comprising:
    a substrate,
    a ceramics layer formed on said substrate, said ceramics layer comprising a nitride, carbide or carbonitride of at least one element of elements in Group IVa, Va, Via or IIIb in the periodic table, and having a thickness of 0.2 $\mu$m or over and less than 5 $\mu$m;
    an interlayer formed on said ceramics layer, said interlayer comprising at least one element of elements in Group IVa, Va, VIa and IIIb and elements in Group IVb except carbon of the periodic table, and said interlayer having a thickness of 0.5 nm or over and less than 10 nm; and
    an amorphous carbon film formed on said interlayer.

13. The amorphous carbon covered member as claimed in claim 12 comprising forming said interlayer simultaneously with etching of said ceramics layer formed on said substrate by applying a negative bias voltage to said substrate in presence of at least ions of an element forming said interlayer.

14. The amorphous carbon covered member as claimed in 13 wherein said interlayer is formed by ion plating, sputter deposition or vacuum arc deposition.

15. The amorphous carbon covered member as claimed in claim 12 wherein said interlayer comprises at least one of Ti, Zr, Hf, V, Nb, Ta, Cr, Mo, W and Si.

16. The amorphous carbon covered member as claimed in claim 15 wherein said amorphous carbon film is formed by sputter deposition or vacuum arc deposition.

17. The amorphous carbon covered member as claimed in claim 12 wherein said ceramics layer comprises at least one of TiAlN, ZrN and VN.

18. The amorphous carbon covered member as claimed in claim 17 wherein said interlayer comprises at least one of Ti, Zr, Hf V, Nb, Ta, Cr, Mo, W and Si.

19. The amorphous carbon covered member as claimed in claim 12 wherein said amorphous carbon film has a Knoop hardness (Hv) of 1200 or over and 8000 or under.

20. The amorphous carbon covered member as claimed in claim 12 wherein said substrate is at least one of ceramics, iron-base alloys, aluminum alloys, iron-base sintered materials, cemented carbides of tungsten carbide-base metals, diamond sintered materials, and cubic boron nitride sintered materials.

21. The amorphous carbon covered member as claimed in claim 12 wherein the member comprises at least one of cutting tool, mold and machine part.

22. A method of coating amorphous carbon film, comprising forming on a substrate a ceramic layer comprising a nitride, carbide or carbonitride of at least one element, of elements in Group IVa, Va, VIa and IIIb in the periodic table and having a thickness of 0.2 $\mu$m to 5 $\mu$m, applying a negative bias voltage to the substrate in the presence of ions of at least one element selected from the group consisting of Ti, Zr, Hf, Cr, W, Al, Ga, In, Tl, Sn and Pb to irradiate said ions on the surface of said substrate, thereby etching the surface of said substrate, and simultaneously forming an interlayer comprising said at least one element and having a thickness of 0.5 nm to 10 nm, and coating an amorphous carbon film on a top layer of the interlayer.

23. The method of coating amorphous carbon film as claimed in claim 22 wherein the interlayer is synthesized by ion plating, sputtering or vacuum arc deposition.

24. The method of coating amorphous carbon film as claimed in claim 23 wherein said amorphous carbon film is formed by sputtering or vacuum arc deposition.

25. The method of coating amorphous carbon film as claimed in claim 22 wherein said amorphous carbon film is formed by sputtering or vacuum arc deposition.

26. An amorphous carbon covered member consisting essentially of:
    a substrate;
    an interlayer formed on said substrate, said interlayer comprising at least one element selected from the group consisting of Ti, Zr, Hf, Cr, W, Al, Ga, In, Tl, Sn and Pb, and said interlayer having a thickness of 0.5 nm or over and less than 10 nm; and
    an amorphous carbon film farmed on said interlayer; and said interlayer is formed simultaneously with etching of said surface of said substrate by applying a negative bias voltage to said substrate in presence of at least ions of an element firming said interlayer.

27. An amorphous carbon covered member consisting essentially of:
    a substrate,
    a ceramics layer formed on said substrate, said ceramics layer comprising a nitride, carbide or carbonitride of at least one element of elements in Group IVa, Va, VIa or IIIb in the periodic table, and having a thickness of 0.2 $\mu$m or over and less than 5 $\mu$m;
    an interlayer formed on said ceramics layer, said interlayer comprising at least one element of elements in Group IVa, Va, VIa and IIIb and elements in Group IVb except carbon of the periodic table, and said interlayer having a thickness of 0.5 nm or over and less than 10 nm; and
    an amorphous carbon film formed on said interlayer.

* * * * *

UNITED STATES PATENT AND TRADEMARK OFFICE
CERTIFICATE OF CORRECTION

PATENT NO.     : 6,821,624 B2
DATED          : November 23, 2004
INVENTOR(S)    : Y. Utsumi et al.

It is certified that error appears in the above-identified patent and that said Letters Patent is hereby corrected as shown below:

Column 19,
Line 65, after "Hf" insert -- , --.
Line 65, "Ti" (second occurence) should be -- TI --.

Column 21,
Line 5, "claim 1" should be -- claim 3 --.
Line 22, "Ti" should be -- TI --.

Column 22,
Line 3, after "Hf" insert -- , --.
Line 17, after "element" delete ",".
Lines 22 and 43, "TI" should be -- TI --.
Line 46, "farmed" should be -- formed --.
Line 50, "firming" should be -- forming --.

Signed and Sealed this

Sixteenth Day of August, 2005

JON W. DUDAS
*Director of the United States Patent and Trademark Office*

(12) EX PARTE REEXAMINATION CERTIFICATE (7136th)
United States Patent
Utsumi et al.

(10) Number: US 6,821,624 C1
(45) Certificate Issued: Nov. 3, 2009

(54) AMORPHOUS CARBON COVERED MEMBER

(75) Inventors: Yoshiharu Utsumi, Itami (JP);
Kazuhiko Oda, Itami (JP)

(73) Assignee: Sumitomo Electric Industries, Ltd., Chuo-Ku, Osaka (JP)

Reexamination Request:
No. 90/008,698, Jun. 12, 2007

Reexamination Certificate for:
Patent No.: 6,821,624
Issued: Nov. 23, 2004
Appl. No.: 09/790,609
Filed: Feb. 23, 2001

Certificate of Correction issued Aug. 16, 2005.

(30) Foreign Application Priority Data

Feb. 25, 2000 (JP) .................................. 2000-049327
Jan. 25, 2001 (JP) .................................. 2001-016954

(51) Int. Cl.
C23C 14/06 (2006.01)
C23C 14/02 (2006.01)
C23C 16/02 (2006.01)
C23C 16/26 (2006.01)
C23C 28/00 (2006.01)
C23C 28/04 (2006.01)

(52) U.S. Cl. .................. 204/192.1; 204/192.11; 204/192.16; 204/192.32; 204/192.34; 428/216; 428/217; 428/336; 428/698; 51/307

(58) Field of Classification Search .................. None
See application file for complete search history.

(56) References Cited

U.S. PATENT DOCUMENTS 4,774,130 A 9/1988 Endo et al.

FOREIGN PATENT DOCUMENTS

| DE | 36 30 418 | 12/1987 |
| EP | 0 605 992 B1 | 7/1994 |
| EP | 0 828 015 A2 | 3/1998 |
| JP | 64-042575 | 2/1989 |
| JP | 06-057427 | 3/1994 |
| JP | 08-013148 | 1/1996 |
| JP | 09/165282 | 6/1997 |
| JP | 10-130865 | 5/1998 |
| JP | 2000-001768 | 1/2000 |
| WO | 98/54376 | 12/1998 |

OTHER PUBLICATIONS

Office Action for corresponding German Application No. 101 08 3440.–45, issued Dec. 4, 2007 with English translation.

*Primary Examiner*—Stephen J Stein

(57) ABSTRACT

For machine parts, cutting tools and molds used under extremely high contact pressures, an amorphous carbon film is provided which has a sufficient adhesion to a substrate. The amorphous carbon covered member has an interlayer comprising at least one element selected from the group consisting of elements in the IVa, Va, VIa and IIIb groups and the IVb group except carbon in the periodic table, or a carbide of at least one element selected from the group, and an amorphous carbon film formed on the interlayer. The interlayer has a thickness of 0.5 nm or over and less than 10 nm.

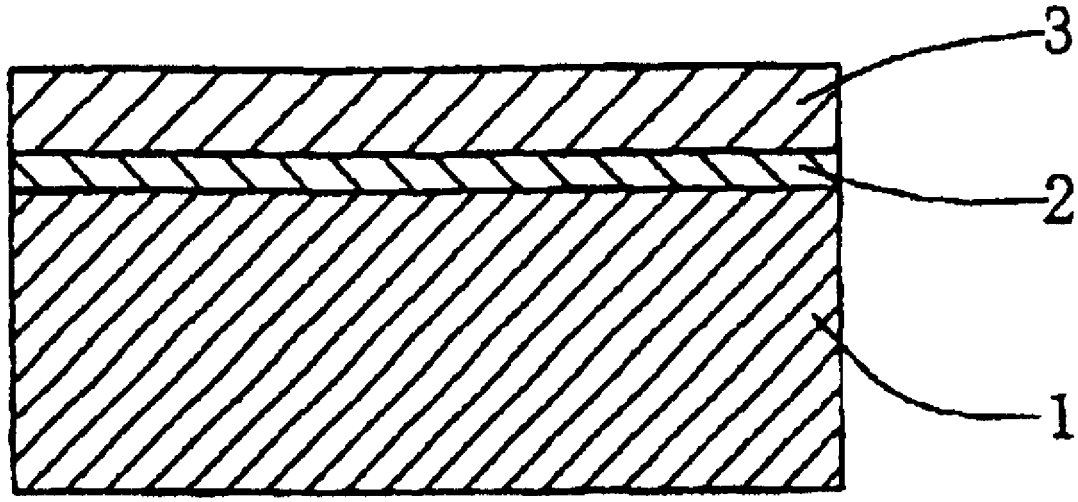

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 22–25 and 27 is confirmed.

Claims 1–7 and 26 are cancelled.

Claims 8, 10, 12 and 14 are determined to be patentable as amended.

Claims 9, 11, 13 and 15–25, dependent on an amended claim, are determined to be patentable.

8. A method of coating amorphous carbon film, comprising applying a negative bias voltage *of not less than 300 V and not more than 1500V at an atmospheric pressure of not more than 0.133 Pa* to a substrate having a surface in the presence of ions of at least one element selected from the group consisting of Ti, Zr, Hf, Cr, W, Al, Ga, In, TI, Sn and Pb to irradiate said ions on the surface of said substrate, thereby etching the surface of said substrate, and simultaneously forming *on said substrate* an interlayer comprising said at least one element and having a thickness of 0.5 nm to [10] *5* nm, and coating an amorphous carbon film on a top layer of the interlayer, *wherein the interlayer is carbonized during the coating of the amorphous carbon film onto the top layer of the interlayer and converted into a carbide containing intermediate layer by applying a negative bias voltage of not less than 50 V at an atmospheric pressure of not more than 0.7 Pa.*

10. The method[,] of coating amorphous carbon film as claimed in claim 9 wherein said amorphous carbon film is formed by sputtering or vacuum arc deposition.

12. An amorphous carbon covered member comprising:

a substrate, a ceramics layer formed on said substrate, said ceramics layer comprising a nitride, carbide or carbonitride of at least one element of elements in Group IVa, Va, [VIa] *VIa* or IIIb in the periodic table, and having a thickness of 0.2 μm or over and less than 5 μm;

an interlayer formed on said ceramics layer, said interlayer comprising at least one element of elements in Group IVa, Va, VIa and IIIb and elements in Group IVb except carbon of the periodic table, and said interlayer having a thickness of 0.5 nm or over and less than 10 nm; and an amorphous carbon film formed on said interlayer.

14. The amorphous carbon covered member as claimed in *claim* 13 wherein said interlayer is formed by ion plating, sputter deposition or vacuum arc deposition.

* * * * *